(12) United States Patent
Cho

(10) Patent No.: US 7,869,295 B2
(45) Date of Patent: Jan. 11, 2011

(54) SEMICONDUCTOR MEMORY APPARATUS

(75) Inventor: Ho Youb Cho, Gyeonggi-do (KR)

(73) Assignee: Hynix Semiconductor Inc., Ichon-shi (JP)

( * ) Notice: Subject to any disclaimer, the term of this patent is extended or adjusted under 35 U.S.C. 154(b) by 0 days.

(21) Appl. No.: 12/535,827

(22) Filed: Aug. 5, 2009

(65) Prior Publication Data

US 2009/0296508 A1    Dec. 3, 2009

Related U.S. Application Data

(62) Division of application No. 11/637,758, filed on Dec. 13, 2006, now Pat. No. 7,580,306.

(30) Foreign Application Priority Data

Feb. 28, 2006    (KR) .................. 10-2006-0019444

(51) Int. Cl.
  *G11C 7/02*    (2006.01)
(52) U.S. Cl. ............... 365/210.12; 365/207; 365/210.1
(58) Field of Classification Search ............. 365/210.1, 365/210.12, 207
  See application file for complete search history.

(56) References Cited

U.S. PATENT DOCUMENTS

| | | | |
|---|---|---|---|
| 5,293,338 A | 3/1994 | Ihara | |
| 5,835,423 A | 11/1998 | Harima | |
| 6,717,880 B2 | 4/2004 | Jeong | |
| 6,853,593 B1 | 2/2005 | Bae | |
| 6,925,020 B2 | 8/2005 | Kwon | |
| 7,038,957 B2 | 5/2006 | Kwack et al. | |
| 2002/0084830 A1 | 7/2002 | Seo et al. | |
| 2005/0013175 A1* | 1/2005 | Bae ................. | 365/189.09 |
| 2005/0243624 A1 | 11/2005 | Jang | |
| 2006/0245284 A1 | 11/2006 | Do | |
| 2007/0070706 A1* | 3/2007 | Kang ................. | 365/185.23 |
| 2007/0070711 A1 | 3/2007 | Kim | |
| 2007/0070777 A1 | 3/2007 | Kim | |
| 2007/0076500 A1 | 4/2007 | Im et al. | |

FOREIGN PATENT DOCUMENTS

| | | |
|---|---|---|
| JP | 2003203484 | 7/2003 |
| JP | 2003228981 | 8/2003 |
| KR | 1020010063908 | 7/2001 |
| KR | 1020010083482 | 9/2001 |
| KR | 1020050041623 | 5/2005 |

* cited by examiner

*Primary Examiner*—Ly D Pham
(74) *Attorney, Agent, or Firm*—Venable LLP; Jeffri A. Kaminski

(57) ABSTRACT

A semiconductor memory apparatus includes a sense amplifier that receives a driving voltage through a sense amplifier power supply input terminal and detects and amplifies a difference between signals that are supplied to two input lines, a sense amplifier voltage supply unit that supplies a driving voltage and an overdriving voltage higher than the driving voltage to the sense amplifier through the sense amplifier power supply input terminal using a power supply voltage, and a driving voltage control unit that maintains a driving voltage level of the sense amplifier power supply input terminal in response to the level of the power supply voltage, after a voltage of the sense amplifier power supply input terminal is elevated to a power supply level responding to the overdriving voltage in order to perform the overdriving operation.

14 Claims, 7 Drawing Sheets

US 7,869,295 B2

SEMICONDUCTOR MEMORY APPARATUS

CROSS-REFERENCE TO RELATED PATENT APPLICATION

This application is a divisional of U.S. patent application Ser. No. 11/637,758, filed Dec. 13, 2006, the subject matter of which application is incorporated herein by reference in its entirety.

This application claims the benefit of Korean Patent Application No. 10-2006-0019444, filed on Feb. 28, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and in particular, to a power supply circuit for a bit-line sense amplifier of a semiconductor memory apparatus.

2. Related Art

As semiconductor related technologies are developed, the number of memory cells in semiconductor memory apparatuses increases. Therefore, when manufacturing semiconductor memory apparatuses, by making a unit cell that is capable of storing data have the smallest possible size within technical limitations, large numbers of unit cells can be integrated in one semiconductor memory apparatus. Thus, since the unit cell is minutely designed so as to have a size of submicron or less, the size of a signal corresponding to data that is stored in one minute unit cell is very small. Meanwhile, in order to read the data that is stored in the memory cell of the semiconductor memory apparatus, an operation of detecting and amplifying the data in the unit cell is inevitably necessary. A sense amplifier is a circuit for detecting and amplifying the data in the unit cell.

Further, there has been a demand for low power consumption of the semiconductor memory apparatus. For this demand, the amount of a power supply voltage used for operating the semiconductor memory apparatus is reduced. Further, recently, a semiconductor memory apparatus that is capable of operating at a power supply voltage of 1.5 V or less has been developed. However, even though the power consumption is reduced due to the reduced potential of the power supply voltage of the semiconductor memory apparatus, there is a problem in that an operational timing for inputting and outputting data is increased.

Some ideas for satisfying the requirements such as low power consumption and reduced data input/output timing are applied to the semiconductor memory apparatus, and one of them relates to an over driving operation.

The over driving operation refers to a method of reducing or optimizing the operational timing by temporarily applying a voltage having a higher level than an internal voltage level that is required for actual operation. According to the over driving operation, by temporarily increasing the driving voltage level of the sense amplifier at an initial step in which the sense amplifier detects and amplifies the data of the unit cell, the sense amplifier can quickly detect and amplify the data.

For this reason, a circuit that supplies the driving voltage to the sense amplifier must supply different voltage at every timing.

FIG. 1 is a block diagram schematically showing a structure of a sense amplifier of a typical semiconductor memory apparatus.

Referring to FIG. 1, a semiconductor memory apparatus generally includes a cell region 10 in which a plurality of unit cells are arranged; a bit-line sense amplifier unit 20 in which a plurality of sense amplifiers are arranged to detect and amplify data signals stored in the unit cells of the cell region 10; a data input/output unit 40 that outputs data signal amplified by the bit-line sense amplifier unit 20; and a sense amplifier voltage supply unit 30 that supplies a driving voltage to the bit-line sense amplifier unit 20.

In the cell region 10, the plurality of unit cells are arranged in an array, and a data signal of the unit cell that is selected so as to correspond to an input address is detected and amplified by the bit-line sense amplifier unit 20, and then transferred to the data input/output unit 40 to be output. In this case, the driving voltage for driving the bit-line sense amplifier unit 20 is supplied from the sense amplifier voltage supply unit 30.

FIG. 2 is a block diagram showing a sense amplifier circuit according to the related art.

Referring to FIG. 2, as described above, the semiconductor memory apparatus according to the related art includes a cell region 10 having a plurality of unit cells, a sense amplifier unit 21 for detecting and amplifying data signals stored in the unit cells, and a sense amplifier voltage supply unit 30 for supplying driving voltages RTO and SB to the sense amplifier 21. Even though the bit-line sense amplifier unit 20 shown in FIG. 1 includes a plurality of sense amplifiers, only one sense amplifier 21 is shown in FIG. 2 for the sake of convenience.

First, the driving voltages RTO and SB are supplied from the sense amplifier voltage supply unit 30 to the bit-line sense amplifier 21 to drive the bit-line sense amplifier 21. The driving voltage RTO has a voltage level corresponding to a power supply voltage, and the driving voltage SB has a voltage level corresponding to a ground voltage.

As such, when an address is input, a unit cell that corresponds to the address information is selected (for example, a unit cell 11 is selected) and the data signal stored in the selected unit cell 11 is supplied to a bit line BL.

Then, the bit-line sense amplifier 21 detects a signal difference between the bit line BL to which a data signal is supplied and a bit line bar /BL to which no data signal is supplied and amplifies the bit line pair BL and /BL to have a high level and a low level, respectively, in response to the detected result.

However, as mentioned above, since the level of the power supply voltage of the semiconductor memory apparatus is decreasing, the driving voltage RTO is decreased in correspondence to the decrease of the level of the power supply voltage. Therefore it takes a large amount of time for the bit-line sense amplifier 21 to amplify the bit-line pair BL and /BL to have a high level and a low level. That is, there is a problem in that the voltage difference between the bit-line pair is reduced due to the decreased level of power supply voltage, and thus it takes a large amount of time to detect and amplify the voltage difference.

In order to solve the above problem, by applying the above-mentioned over driving method, at an initial step of detecting and amplifying the signal difference between the bit line pair BL and /BL, a high level of voltage is supplied from the sense amplifier voltage supply unit 30 as a driving voltage RTO, and at the following step thereof, the driving voltage RTO is returned to a voltage level that is normally used when the sense amplifier is driven.

Generally, as the high level of driving voltage RTO, an external power supply voltage VDD that is input to the semiconductor memory apparatus or a power supply voltage Vperi of a peripheral circuit of the semiconductor memory apparatus is used. The power supply voltage of the peripheral circuit is supplied to a peripheral region such as an input/output buffer or a decoder. A core voltage VCORE that is used in an inner core region of the semiconductor memory apparatus is used as a voltage level of a reduced driving voltage RTO. The core voltage VCORE is a voltage maintained at a lower voltage level than the power supply voltage VDD by a predetermined level and is used to drive the core region of the semiconductor memory apparatus.

Therefore, since a voltage that is higher than a normal driving voltage level is used during an initial step, that is, an overdriving period when the bit-line sense amplifier detects and amplifies the voltage difference between the bit-line pair BL and /BL, an addition circuit is needed to return to the original driving voltage level after the over driving period.

The sense amplifier voltage supply unit 30 supplies a high level bit-line sense amplifier driving voltage RTO during the over driving period, and discharges the original bit-line sense amplifier driving voltage RTO to a predetermined level so as to be applied to the bit-line sense amplifier.

That is, the semiconductor memory apparatus according to the related art discharges the elevated level of the bit-line sense amplifier driving voltage RTO during a selective timing by the sense amplifier voltage supply unit 30.

However, the level of the power supply voltage or the core voltage of the semiconductor memory apparatus may be varied due to noise. Also, when the level of the power supply voltage and the core voltage are changed depending on a type of the applied system, the detecting process or the amplifying process of the bit-line sense amplifier may not be smoothly performed due to the operation that discharges the elevated level of the bit-line sense amplifier driving voltage RTO during the selective timing.

Further, when the level of the bit-line sense amplifier driving voltage RTO is significantly over discharged, an error may occur in the following operating of the bit-line sense amplifier after the over driving operation.

SUMMARY OF THE INVENTION

An embodiment of the present invention provides a semiconductor memory apparatus that is capable of preventing an error by optimally discharging after increasing a driving voltage of a bit-line sense amplifier for an overdriving operation.

Another embodiment of the present invention provides a semiconductor memory apparatus that performs the overdriving operation during an optimal timing period and stabilizes an operation of the bit-line sense amplifier after the overdriving operation.

Still another embodiment of the present invention provides a semiconductor memory apparatus that allows a sense amplifier to perform a reliable sensing operation by optimally discharging an overdriving voltage.

Still another embodiment of the present invention provides a semiconductor memory apparatus that secures an optimal period by controlling a discharge period for the overdriving voltage.

An embodiment of the present invention provides a semiconductor memory apparatus including a sense amplifier that has two input lines, receives a driving voltage through a power supply input terminal and detects and amplifies a difference between signals that are supplied to the two input lines; a sense amplifier voltage supply unit that supplies a driving voltage and an overdriving voltage to the sense amplifier through a power supply input terminal of the sense amplifier using a power supply voltage, the overdriving voltage being higher than the driving voltage; and a driving voltage control unit that maintains a driving voltage level of the power supply input terminal of sense amplifier in response to the level of the power supply voltage, after a voltage of the sense amplifier power supply input terminal is elevated to a power supply level responding to the overdriving voltage in order to perform the overdriving operation.

Another embodiment of the present invention provides a semiconductor memory apparatus including a sense amplifier that receives a driving voltage through a sense amplifier power supply input terminal and detects and amplifies a difference between signals that are supplied to two input lines; a sense amplifier voltage supply unit that supplies a driving voltage and an overdriving voltage to the sense amplifier through the sense amplifier power supply input terminal using a power supply voltage, the overdriving voltage being higher than the driving voltage; a voltage detecting unit that detects a power supply voltage level; and a timing control unit that decreases the voltage level of the sense amplifier power supply input terminal from the overdriving voltage level to the driving voltage level using a timing signal corresponding to the detected state of the voltage detecting unit.

Still another embodiment of the present invention provides a method of driving a semiconductor memory apparatus including performing a first data access operation using an overdriving voltage that is elevated so as to be a predetermined level higher than a normal driving voltage; detecting the overdriving voltage level; generating a sectional signal corresponding to the detected result; reducing a node voltage that is elevated to the overdriving voltage level to the normal driving voltage level corresponding to the sectional signal; and performing a second data access operation using the normal driving voltage level.

Still another embodiment of the present invention provides a method of driving a semiconductor memory apparatus including performing a first data access operation using an overdriving voltage that is elevated so as to be a predetermined level higher than a normal driving voltage; detecting the overdriving voltage level; generating a sectional signal corresponding to the detected result; reducing a node voltage that is elevated to the overdriving voltage level to the normal driving voltage level corresponding to the sectional signal; and performing a second data access operation using the normal driving voltage level.

DESCRIPTION OF EXEMPLARY EMBODIMENT

Hereinafter, preferred embodiments of the present invention will be described below in detail with reference to the accompanying drawings.

Figure 3:
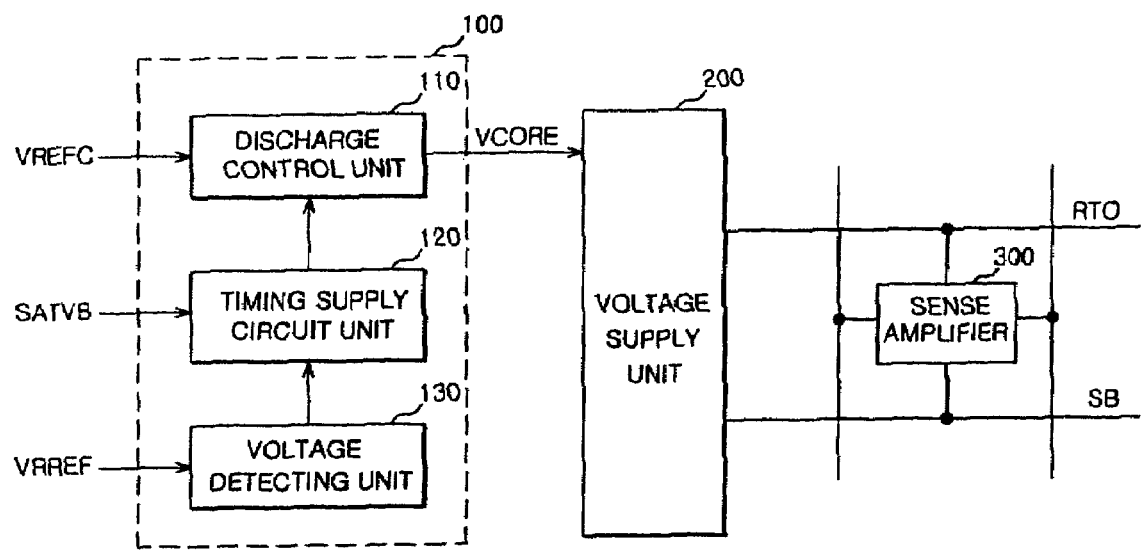
FIG. 3 is a block diagram illustrating a semiconductor memory apparatus according to an exemplary embodiment of the present invention.

Referring to FIG. 3, a semiconductor memory apparatus according to the embodiment includes a sense amplifier 300 that has two input lines, receives a driving voltage through a sense amplifier power supply input terminal RTO and detects and amplifies a difference between signals that are supplied to the two input lines.

The semiconductor memory apparatus further includes a sense amplifier voltage supply unit 200 that supplies a driving voltage and an overdriving voltage to the sense amplifier 300 through the sense amplifier power supply input terminal RTO using a power supply voltage. The overdriving voltage is higher than the driving voltage.

The semiconductor memory apparatus further includes a driving voltage control unit 100. The driving voltage control unit 100 maintains a driving voltage level of the sense amplifier power supply input terminal RTO in response to the level of the power supply voltage, after a voltage of the sense amplifier power supply input terminal RTO is elevated to a power supply level according to the overdriving voltage in order to perform the overdriving operation. The driving voltage control unit 100 includes a discharge control unit 110, a timing supply circuit unit 120, and a voltage detecting unit 130. Firstly, the voltage detecting unit 130 detects a level of the power supply voltage. The timing supply circuit unit 120 supplies a timing corresponding to the detected state of the voltage detecting unit 130. The discharge control unit 110 performs a discharging operation in response to the timing supplied from the timing supply circuit unit 120 such that the voltage level of the sense amplifier power supply input terminal RTO is decreased from an overdriving voltage level to a driving voltage level.

Figure 4:
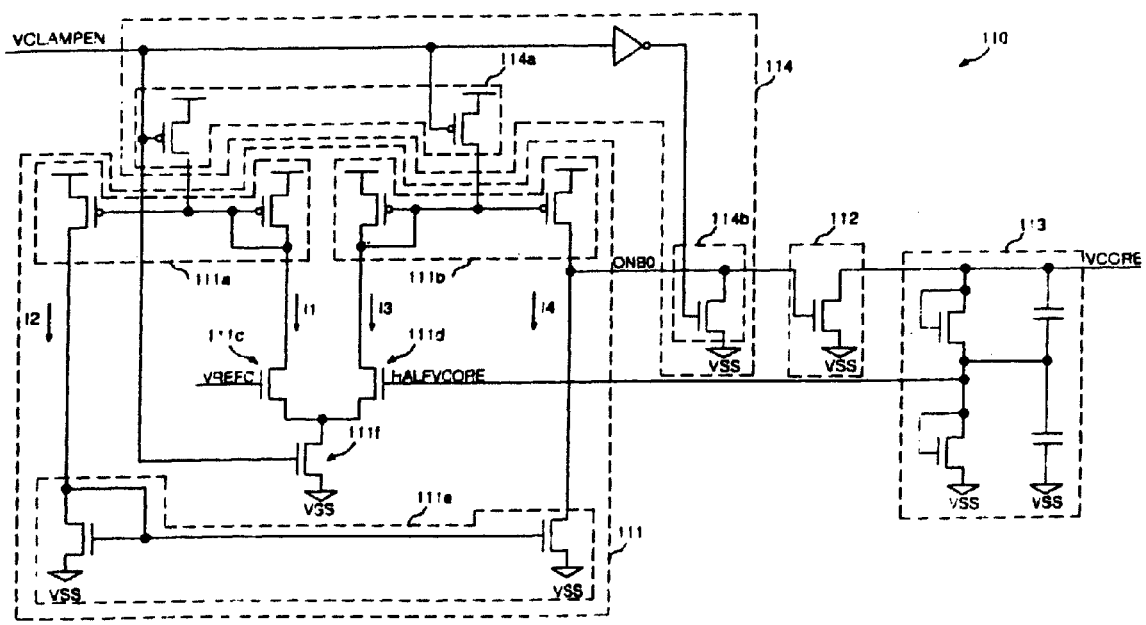
FIG. 4 is an internal circuit diagram illustrating a discharge control unit shown in FIG. 3.

FIG. 4 is an internal circuit diagram of the discharge control unit 110 shown in FIG. 3.

Referring to FIG. 4, the discharge control unit 110 includes a signal comparing unit 111, a discharging unit 112, a feedback circuit unit 113, and an enabling unit 114. The signal comparing unit 111 compares a reference signal VREFC and a feedback signal HALFVCORE to generate a comparison signal ONBO. The discharging unit 112 discharges a signal output terminal VCORE connected to the sense amplifier power supply input terminal RTO such that the voltage level of the sense amplifier power supply input terminal RTO is decreased from an overdriving voltage level to a driving voltage level, in response to the comparison signal. The enabling unit 114 controls an enable state of the discharging unit 112 in response to a timing signal VCLAMPEN supplied from the timing supply circuit unit 120. The feedback circuit unit 113 divides the voltage level applied to a signal output terminal of the discharging unit into predetermined levels to output a feedback signal HALFVCORE.

The enabling unit 114 selectively enables the signal comparing unit 111, in response to the timing signal VCLAMPEN supplied from the timing supply circuit unit 120.

The enabling unit 114 includes a first enabling unit 114a that enables the signal comparison unit 114 and a second enabling unit 114b that enables the discharging unit 112.

The discharging unit 112 includes an NMOS transistor that receives the comparison signal ONBO through a gate to connect the signal output terminal VCORE and the ground terminal VSS.

The first enabling unit 114a includes an NMOS transistor that connects the gate of the NMOS transistor of the discharging unit 112 to the ground terminal VSS in response to the timing signal VCLAMPEN supplied from the timing supply circuit unit 120.

The signal comparison unit 111 includes a first current mirror 111a, a second current mirror 111b, a first signal input unit 111c, a second signal input unit 111d, a third current mirror 111e, and a current discharging unit 111f. The first current mirror 111a supplies a first current I1 and a second current I2, and the second current mirror 111b supplies a second current I3 and a fourth current I4. The first signal input unit 111c controls the amount of first current I1 supplied from the first current mirror 111a in response to the reference signal VREFC and the second signal input unit 111d controls the amount of third current I3 supplied from the second current mirror 111b in response to the feedback signal HALFVCORE. The third current mirror 111e makes substantially the fourth current I4 supplied from the second current mirror 111b identically with the second current I2 supplied from the first current mirror 111a by the current mirroring technique. The current discharging unit 111f discharges currents supplied from the first signal input unit 111c and the second signal input unit 111d, in response to the timing signal VCLAMPEN supplied from the timing supply circuit unit 120.

The first enabling unit 114a includes two NMOS transistors that enable the first current mirror 111a and the second current mirror 111b in response to the timing signal VCLAMPEN. The second enabling unit 114b includes a NMOS transistor that selectively enables the discharging unit 112.

Further, the first current mirror 111a and the second current mirror 111b mirror currents using PMOS transistors. Furthermore, the third current mirror 111e mirrors a current using an NMOS transistor.

The first signal input unit 111c includes an NMOS transistor that receives a reference signal VREFC through a gate to control the amount of first current I1. The second signal input unit 111d includes an NMOS transistor that receives the feedback signal HALFVCORE through a gate to control the amount of second current I2.

The feedback circuit unit 113 includes two MOS transistors that are connected in series between the signal output terminal VCORE and the ground terminal VSS and supplies the feedback signal HALFVCORE through a common node of the two MOS transistors that are connected in series. Each of the two MOS transistors is configured by a diode-connected NMOS transistor. The feedback circuit 113 further includes two capacitors that are connected in series between the signal output terminal VCORE and the ground terminal VSS, and a common node of the two serially connected capacitors is connected to the common node of the two serially connected MOS transistors.

Figure 1:
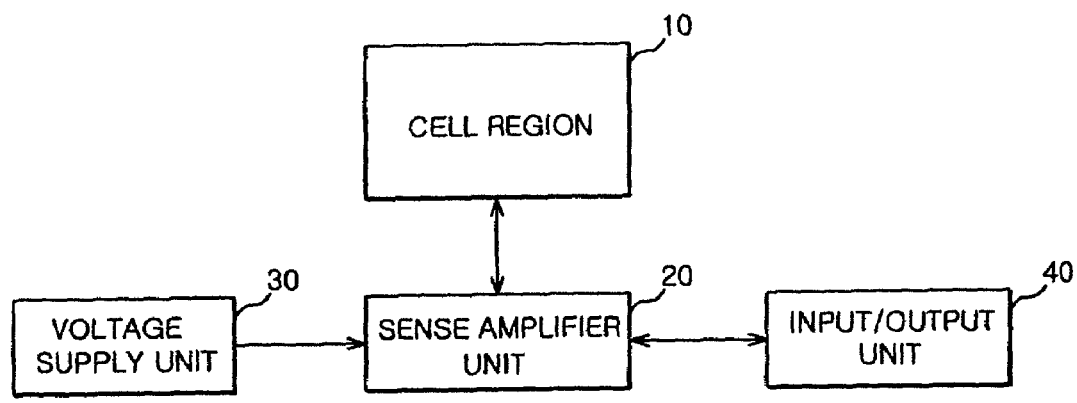
FIG. 1 is a block diagram illustrating a semiconductor memory apparatus according to the related art.
Figure 2:
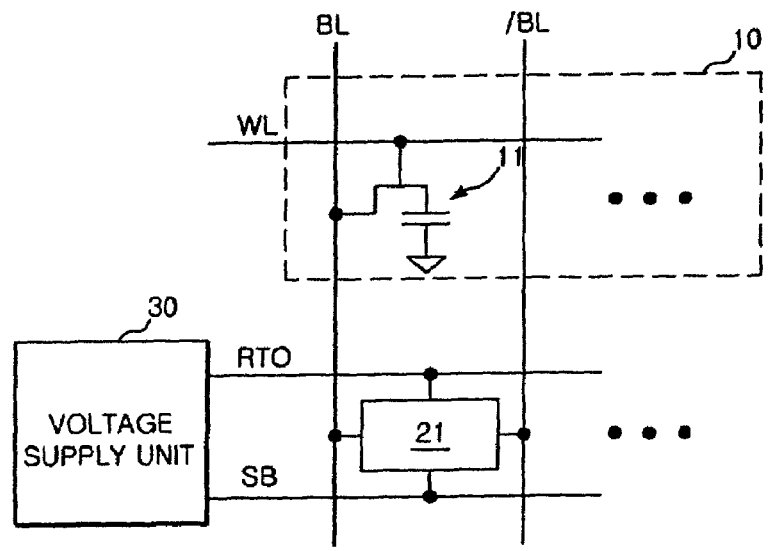
FIG. 2 is a block diagram illustrating a sense amplifier circuit according to the related art.
Figure 5:
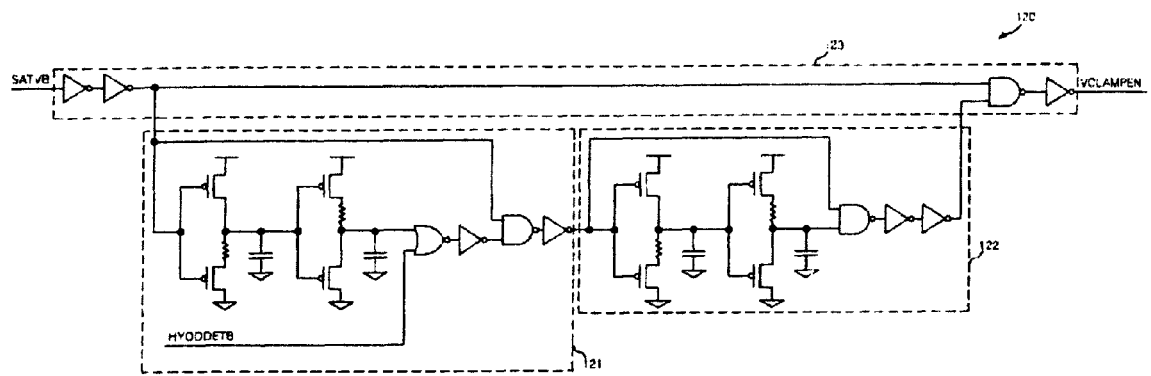
FIG. 5 is an internal circuit diagram illustrating a timing supply unit shown in FIG. 3.

FIG. 5 is an internal circuit diagram of the timing supply circuit unit 120 shown in FIG. 1.

Referring to FIG. 5, the timing supply circuit unit 120 includes a first timing circuit unit 121, a second timing circuit unit 122, and a signal composing unit 123. The first timing circuit unit 121 delays a control signal SATVB during a first timing, and selectively transmits the delayed signal in response to a signal HVDDDETB corresponding to a detected state by the voltage detecting unit 130 to the second timing circuit unit 122. The second timing circuit unit 122 delays the signal transmitted from the first timing circuit unit 121 during a second timing to transmit the delayed signal, and the signal composing unit 123 combines the signal supplied from the second timing circuit unit 122 and the control signal SATVB to output as a timing signal VCLAMPEN. As shown in FIG. 5, the first timing circuit unit 121 and the second timing circuit unit 122 are implemented as pulse generating circuits.

Figure 8:
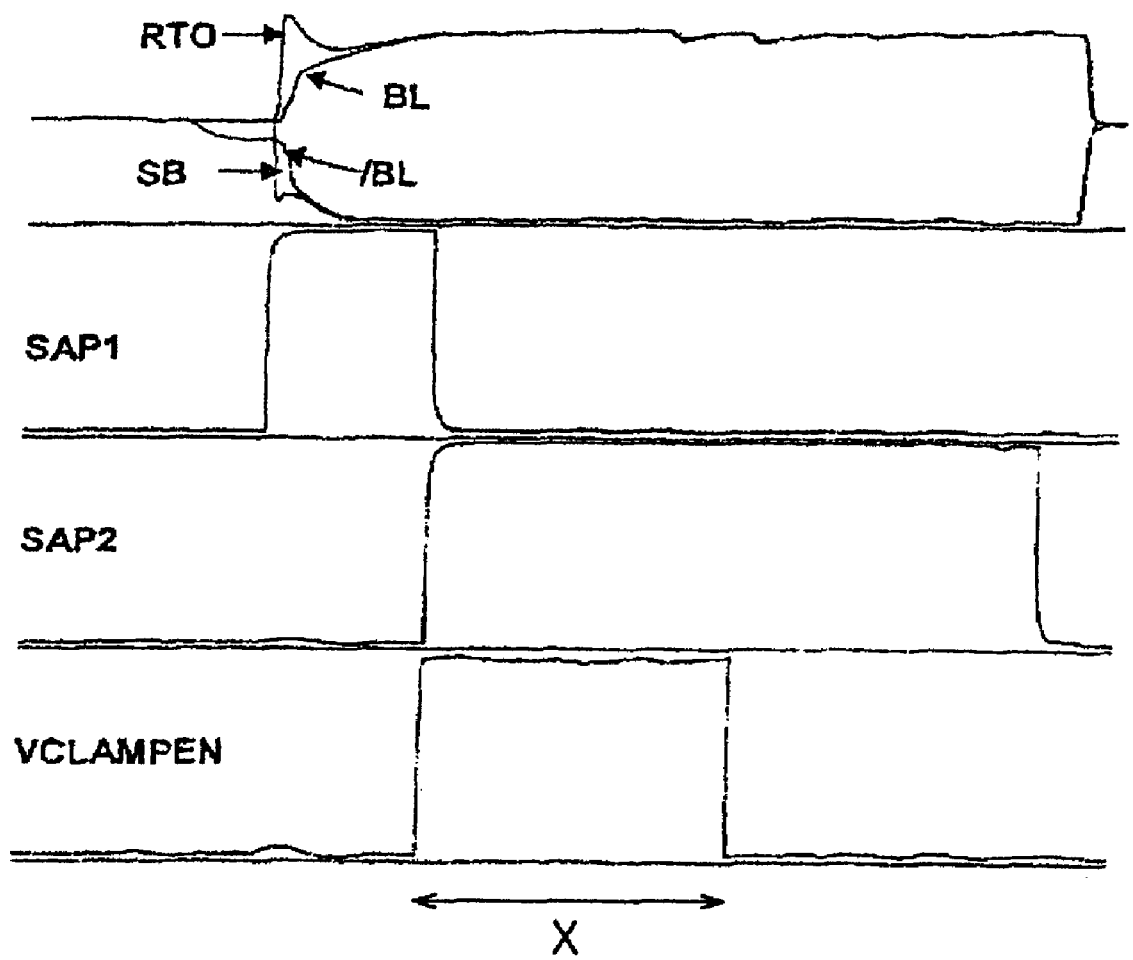
FIG. 8 is a waveform illustrating an operation of the semiconductor memory apparatus shown in FIG. 3.

In FIG. 5, if the first timing period and the second timing period of the first timing circuit unit 121 and the second timing circuit unit 122 are controlled, the pulse period of the timing signal VCLAMPEN of FIG. 8 can also be controlled. Therefore, by controlling the period, it is possible to perform the optimal overdriving control operation. The details will be described below.

Figure 6:
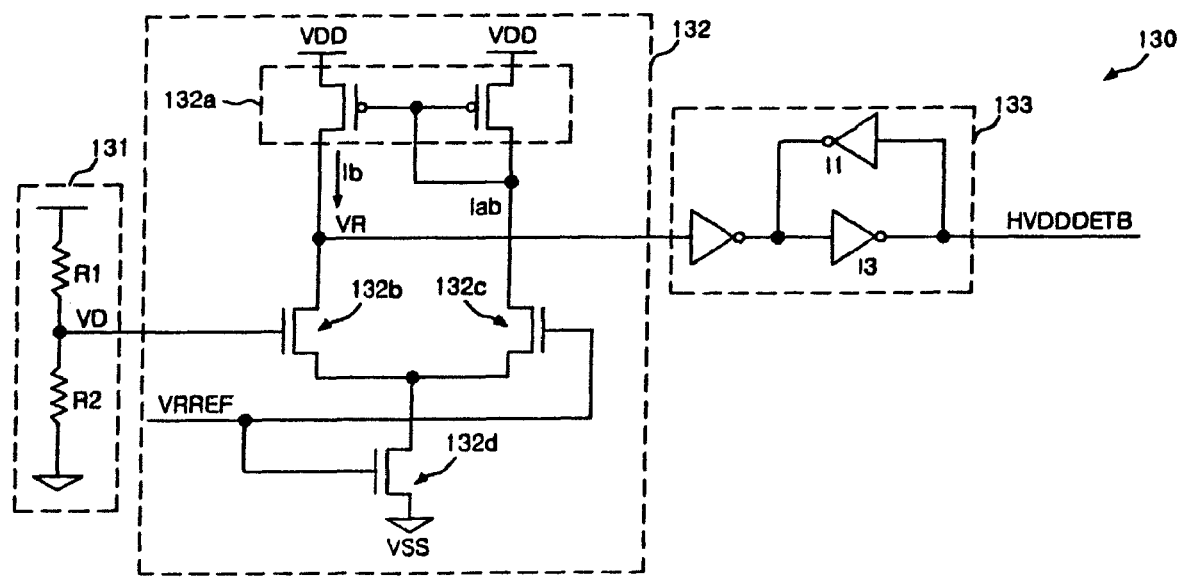
FIG. 6 is an internal circuit diagram illustrating a voltage level detecting unit shown in FIG. 3.

FIG. 6 is an internal circuit diagram of a voltage level detecting unit shown in FIG. 3.

Referring to FIG. 6, the voltage detecting unit 130 includes a power supply voltage divider unit 131 that divides the level of the power supply voltage VDD into predetermined levels; a power supply voltage state detecting unit 132 that outputs a signal VR having information of a power supply voltage level in response to a voltage level difference between the voltage divided by the divider unit 131 and the reference voltage VRREF; and a latch output unit 133 that latches the signal VR having information of a power supply voltage level supplied from the state detecting unit 132 to output to the timing supply circuit unit 120.

The divider unit 131 includes a plurality of resistors R1 and R2 that are connected in series between the power supply terminal VDD and the ground terminal VSS.

The power supply voltage detecting unit 132 includes a differential amplifier that receives the reference voltage VRREF and the divided voltage VD to output a signal VR corresponding to the difference between the two voltages.

The differential amplifier includes a current mirror 132a, a first signal input unit 132c that flows a first current Ia supplied from the current mirror 132a in response to the reference voltage VRREF, a second signal input unit 132b that flows an amount of second current Ib that is mirrored from the first current Ia by the current mirror 132a, responding to the divided voltage VD, and a bias unit 132d that supplies a current supplied by the first signal input unit 132c and the second signal input unit 132b to a ground voltage supply terminal VSS in response to the reference voltage VRREF.

The latch output unit 133 is configured by two inverters I1 and I3 so as to latch the signal VR having information of the power supply voltage level.

Figure 7:
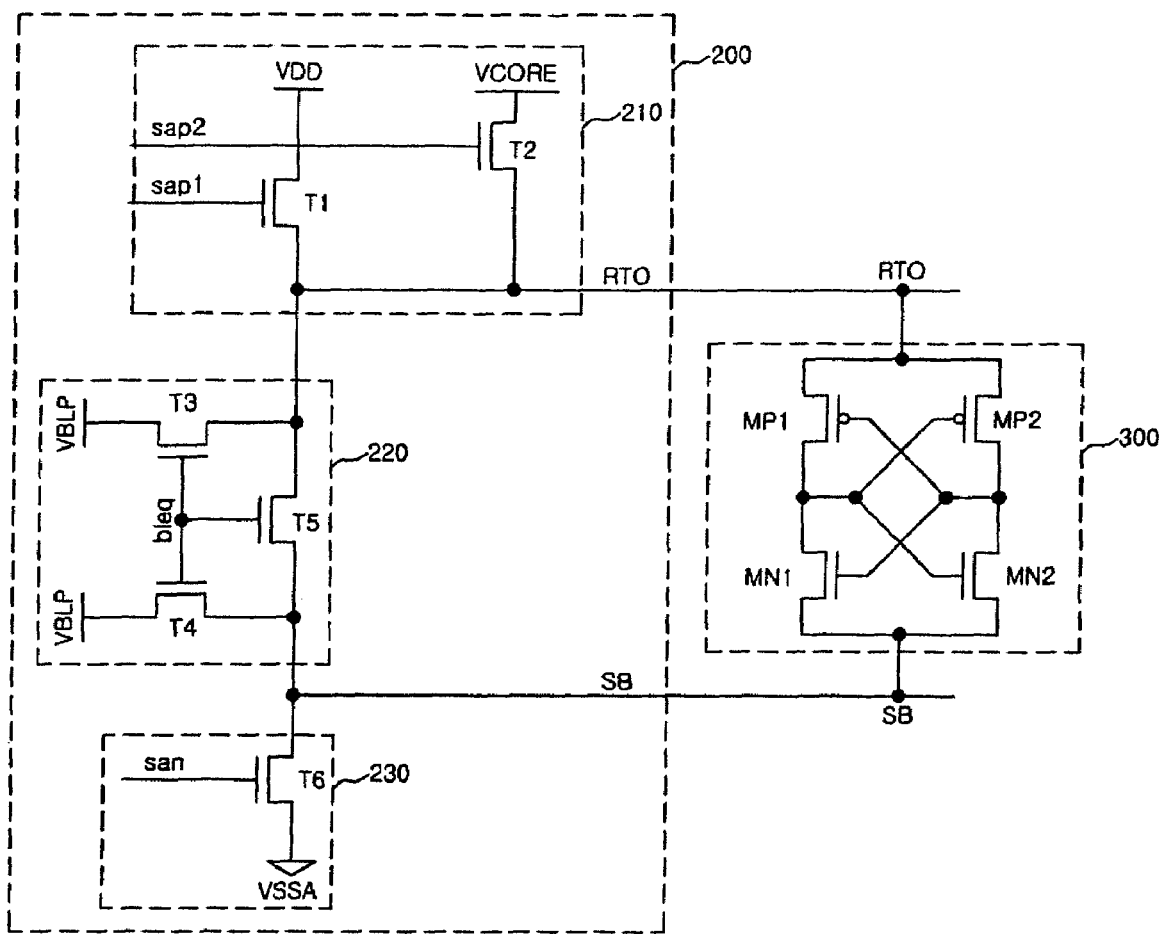
FIG. 7 is an internal circuit diagram illustrating a bit-line sense amplifier and a bit-line sense amplifier voltage supply circuit unit shown in FIG. 3.

FIG. 7 is an internal circuit diagram illustrating a bit-line sense amplifier and a bit-line sense amplifier voltage supply circuit unit shown in FIG. 3.

Referring to FIG. 7, the bit-line sense amplifier 300 has a general sense amplifier structure that includes two NMOS transistors MN1 and MN2 and two PMOS transistors MP1 and MP2 so as to detect and amplify a difference between signals of the bit-line BL and the bit-line bar /BL.

The bit-line sense amplifier voltage supply unit 200 includes a first power supply circuit unit 210 that supplies a high level of a driving voltage of the bit-line sense amplifier to the sense amplifier 300 through the sense amplifier power supply input terminal RTO; a second power supply circuit unit 230 that supplies a low level of a driving voltage of the bit-line sense amplifier to the sense amplifier 300 through the sense amplifier power supply input terminal SB; and a pre-charge circuit unit 220 that maintains the voltage levels of the two power supply input terminals RTO and SB to be a precharge voltage VBLP.

The first power supply circuit unit 210 includes a MOS transistor T1 for a normal power supply that supplies a normal driving voltage and an overdriving MOS transistor T2 that supplies a voltage higher than the normal driving voltage to the sense amplifier via the sense amplifier power supply input terminal RTO during an overdriving operation. The second power supply circuit 230 includes an MOS transistor T6 that supplies a ground voltage to the sense amplifier power supply input terminal SB. The precharge circuit unit 220 includes MOS transistors T3 and T4 that supply precharge voltages VBLP to the power supply input terminals RTO and SB of the sense amplifier, and an MOS transistor TS that makes the voltage level of the two power supply input terminals RTO and SB of the sense amplifier be equal to each other.

FIG. 8 shows a waveform illustrating an operation of the semiconductor memory apparatus shown in FIG. 3. Hereinafter, the operation of the semiconductor memory apparatus will be described with reference to FIGS. 3 to 8.

In the memory apparatus according to an embodiment of the invention, the sense amplifier performs a first data access operation using an overdriving voltage that is elevated to a predetermined level higher than the normal driving voltage. After detecting the overdriving voltage level, a signal for defining a section is generated in correspondence to the detecting results. The node that is elevated to the overdriving voltage level is decreased to a normal driving voltage level in response to the signal for defining the section. And then the sense amplifier performs a second data access operation using the normal driving voltage level.

More specifically, first, the bit-line sense amplifier 300 detects and amplifies the difference between the signals applied to the bit-line BL and the bit line bar. /BL In this case, the driving voltage for driving the bit-line sense amplifier 300 is input from the sense amplifier power supply input terminals RTO and SB.

The sense amplifier voltage supply unit 200 supplies a high level of driving voltage to the bit-line sense amplifier 300 through the sense amplifier voltage input terminal RTO in order to operate the bit-line sense amplifier 300. Further, a low level of driving voltage is supplied to the bit-line sense amplifier 300 through the sense amplifier voltage input terminal SB. In this case, the high level corresponds to a core voltage VCORE of the semiconductor memory apparatus, the low level corresponds to a ground voltage VSS, and the high level may be varied depending on the characteristics of the memory apparatus.

As described above, the semiconductor memory apparatus that demands high speed operation at a low voltage performs an overdriving operation in order to reduce the driving time, at an initial step in which the bit-line sense amplifier detects and amplifies the difference between the signals applied to the bit line BL and the bit line bar/BL. That is, the sense amplifier voltage supply unit 200 supplies a driving voltage having a higher level than the core voltage VCORE, for example, a power supply voltage VDD level, to the sense amplifier power supply input terminal at the initial step in which the bit-line sense amplifier detects and amplifies the difference between the signals applied to the bit line BL and the bit line bar/BL. When the detecting and amplifying operation of the difference between the signals applied the bit line BL and the bit line bar/BL is sufficiently performed by the bit-line sense amplifier 300, the sense amplifier voltage supply unit 200 performs a discharge operation that decreases the level of the sense amplifier power supply input terminal RTO that is elevated to the power supply voltage VDD to the core voltage VCORE.

In this case, the discharge operation is performed such that the voltage detecting unit 130 detects the level of the current power supply voltage, and output the corresponding signal HVDDDETB. Then, the timing supply circuit unit 120 outputs the timing signal VCLAMPEN using the signal HVDDETB output from the voltage detecting unit 130.

Thereafter, the discharge control unit 110 controls the discharge operation of the sense amplifier power supply input terminal in response to the timing signal VCLAMPEN supplied from the timing supply circuit unit 120 such that the voltage level of the sense amplifier power supply input terminal RTO is decreased from the overdriving voltage level (i.e., power supply voltage level) to the driving voltage level.

That is, the discharge control unit 110 detects the overdriving voltage level in response to the timing signal VCLAMPEN supplied from the timing supply circuit unit 120, when the detected level is high, the voltage level HALFVCORE is higher than the voltage level VREFC. Therefore, by outputting the comparison signal ONBO to be a high level, the voltage level of the output signal VCORE is decreased. As a result, since the level of the sense amplifier power supply input terminal RTO is discharged, it is possible to perform a discharge operation during an optimal discharge period.

Therefore, even though the overdriving voltage, that is, power supply voltage level is changed, if the appropriate discharge period is determined, it is possible to prevent abnormal operation of the bit-line sense amplifier.

As shown in FIG. 8, between the overdriving period (a period when the waveform of SPA1 is at a high level) and the normal driving period (a period when the waveform of SPA2 is at a high level), the discharge control unit 110 performs a discharge operation during a period X when the timing signal VCLAMPEN is at a high level.

It will be apparent to those skilled in the art that various modifications and changes may be made without departing from the scope and spirit of the present invention. Therefore, it should be understood that the above embodiments are not limiting, but illustrative in all embodiments. The scope of the present invention is defined by the appended claims rather than by the description preceding them, and therefore all changes and modifications that fall within metes and bounds of the claims, or equivalents of such metes and bounds are therefore intended to be embraced by the claims.

In the disclosed embodiments, even though the overdriving operation of the bit-line sense amplifier is exemplified, this invention may be further applied to any kinds of integrated circuits that temporarily perform at a level higher than a normal driving voltage.

According to embodiments of the invention, it is possible to reliably perform the overdriving operation of the sense amplifier that is provided in the semiconductor memory apparatus. Specifically, even though the driving voltage of the sense amplifier is increased to be higher than the normal driving voltage during the overdriving operation, the driving voltage can be stabilized to be an original driving voltage, which prevents abnormal operation of the sense amplifier after the overdriving operation. This is because the semiconductor memory apparatus according to an embodiment of the present invention can appropriately control the discharge time so as to correspond to the level of the power supply voltage, after the overdriving operation.

What is claimed is:

1. A semiconductor memory apparatus comprising:
    a sense amplifier having two input lines and a power supply input terminal to receive a driving voltage, and configured to detect and amplify a difference between signals that are supplied to the two input lines;
    a sense amplifier voltage supply unit configured to supply a normal driving voltage as the driving voltage in a normal mode through the power supply input terminal of the sense amplifier and an overdriving voltage as the driving voltage in a overdriving mode through the power supply input terminal of the sense amplifier, an overdriving voltage level being higher than a normal driving voltage level; and
    a driving voltage unit configured to detect the overdriving voltage level of the power supply input terminal of the sense amplifier, and supply the normal driving voltage to the power supply input terminal of the sense amplifier using the detected overdriving voltage level, after overdriving mode,
    wherein the driving voltage unit includes a voltage detecting unit, a timing supply circuit unit, and a discharge control unit, and
wherein the voltage detecting unit for detecting a level of a power supply voltage, includes:
    a power supply voltage divider unit configured to divide the level of the power supply voltage into predetermined levels and output a divided voltage;
    a power supply voltage state detecting unit configured to output a signal having information of the level of the power supply voltage in response to a voltage level difference between the divided voltage and a reference voltage; and
    a latch output unit configured to latch the signal having information of the level of the power supply voltage supplied from the power supply voltage state detecting unit for output to a discharge timing control unit.

2. The semiconductor memory apparatus of claim 1, wherein the voltage detecting unit is configured to detect the level of the power supply voltage,
    the timing supply circuit unit is configured to supply a timing signal corresponding to the detected level of the voltage detecting unit, and
    the discharge control unit is configured to control a discharging operation of the power supply input terminal to decrease the voltage level at the power supply input terminal from the overdriving voltage level to the driving voltage in response to the timing signal supplied from the timing supply circuit unit.

3. The semiconductor memory apparatus of claim 2, wherein the power supply voltage state detecting unit includes a differential amplifier configured to receive the reference voltage and the divided voltage to output a signal corresponding to the difference between the reference and the divided voltages.

4. The semiconductor memory apparatus of claim 1, wherein the timing supply circuit unit includes:
    a first timing circuit unit configured to delay a control signal at a first timing to selectively transmit the delayed control signal in response to the detected level by the voltage detecting unit;
    a second timing circuit unit configured to delay the delayed control signal transmitted from the first timing circuit unit at a second timing to transmit the delayed signal; and a signal composing unit configured to provide the delayed signal supplied from the second timing circuit unit and the control signal for output to the discharge control unit.

5. The semiconductor memory apparatus of claim 1, wherein the discharge control unit includes:
   a signal comparing unit configured to compare a reference signal and a feedback signal to output a comparison signal;
   a discharging unit configured to discharge, in response to the comparison signal, a signal output terminal connected to the power supply input terminal such that the voltage of the power supply input terminal is decreased from the overdriving voltage level to the driving voltage level;
   an enabling unit configured to control an enable state of the discharging unit in response to a timing signal supplied from the timing supply circuit unit; and
   a feedback circuit unit configured to divide the voltage applied to the signal output terminal of the discharging unit into predetermined voltages to output the feedback signal.

6. The semiconductor memory apparatus of claim 5, wherein the enabling unit is configured to selectively enable the signal comparing unit, in response to the timing signal supplied from the timing supply circuit unit.

7. The semiconductor memory apparatus of claim 6, wherein the enabling unit includes:
   a first enabling unit configured to selectively enable the signal comparing unit; and
   a second enabling unit configured to selectively enable the discharging unit.

8. The semiconductor memory apparatus of claim 5, wherein the signal comparing unit includes:
   a first current mirror configured to supply a second current obtained by mirroring a first current;
   a second current mirror configured to supply a fourth current obtained by mirroring a third current;
   a first signal input unit configured to control an amount of the first current supplied from the first current mirror in response to the reference signal;
   a second signal input unit configured to control an amount of the third current supplied from the second current mirror in response to the feedback signal;
   a third current mirror configured to supply an amount of current identical to an amount of the fourth current supplied from the second current mirror with the second current supplied from the first current mirror by a mirroring operation; and
   a current discharging unit configured to discharge currents supplied from the first signal input unit and the second signal input unit, in response to the timing signal supplied from the timing supply circuit unit.

9. The semiconductor memory apparatus of claim 8, wherein the first enabling unit includes first and second MOS transistors configured to enable the first current mirror and the second current mirror in response to the timing signal.

10. The semiconductor memory apparatus of claim 9, wherein the second enabling unit includes a third MOS transistor configured to selectively enable the discharging unit.

11. A semiconductor memory apparatus comprising:
    a sense amplifier configured to receive a driving voltage through a sense amplifier power supply input terminal and to detect and amplify a difference between signals that are supplied to two input lines;
    a sense amplifier voltage supply unit configured to supply the driving voltage and an overdriving voltage higher than the driving voltage to the sense amplifier through the sense amplifier power supply input terminal using a power supply voltage; and
    a driving voltage control unit having a voltage detecting unit, a timing supply circuit, and a discharge unit, configured to control the overdriving voltage to a level of the driving voltage during a controllable pulse period,
    wherein the pulse period is controlled by controlling an amount of a delayed signal of a timing control circuit that is provided in the driving voltage control unit, and
    wherein the voltage detecting unit includes:
    a power supply voltage divider unit configured to divide a level of the power supply voltage into predetermined levels;
    a power supply voltage state detecting unit configured to output a signal having information of the level of the power supply voltage in response to a voltage level difference between the voltage divided by the power supply voltage divider unit and a reference voltage; and
    a latch output unit configured to latch the signal having information of the level of the power supply voltage supplied from the power supply voltage state detecting unit to output to a discharge timing control unit.

12. The semiconductor memory apparatus of claim 11, wherein the voltage detecting unit is configured to detect the level of the power supply voltage,
    the timing supply circuit unit is configured to supply a timing signal corresponding to the detected level of the voltage detecting unit, and
    the discharge unit is configured to control the discharging operation of the sense amplifier power supply input terminal so as to decrease the voltage level of the sense amplifier power supply input terminal from the overdriving voltage level to the driving voltage level in response to the timing signal supplied from the timing supply circuit unit.

13. The semiconductor memory apparatus of claim 12, wherein the timing supply circuit unit includes:
    a first timing circuit unit configured to delay a control signal at a first timing to selectively transmit the delayed signal in response to a signal corresponding to a detected voltage level by the voltage detecting unit;
    a second timing circuit unit configured to delay the delayed signal transmitted from the first timing circuit unit at a second timing to transmit the delayed signal; and
    a signal composing unit configured to provide the signal supplied from the second timing circuit unit and the control signal to output to the discharge control unit.

14. The semiconductor memory apparatus of claim 13, wherein the discharge unit includes:
    a signal comparing unit configured to compare a reference signal and a feedback signal to output a comparison signal;
    a discharging unit configured to discharge, in response to the comparison signal, a signal output terminal connected to the sense amplifier power supply input terminal such that the voltage level of the sense amplifier power supply input terminal is decreased from the overdriving voltage level to the driving voltage level;
    an enabling unit configured to control an enable state of the discharging unit in response to the timing signal supplied from the timing supply circuit unit; and
    a feedback circuit unit configured to divide the voltage level applied to a signal output terminal of the discharge unit into predetermined voltages to output the feedback signal.

* * * * *